United States Patent
Nahas

(10) Patent No.: US 7,012,841 B1
(45) Date of Patent: Mar. 14, 2006

(54) CIRCUIT AND METHOD FOR CURRENT PULSE COMPENSATION

(75) Inventor: Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 10/924,631

(22) Filed: Aug. 24, 2004

(51) Int. Cl.
*G11C 7/00* (2006.01)

(52) U.S. Cl. .............................. 365/189.09; 365/230.06

(58) Field of Classification Search ........... 365/189.09, 365/230.06, 189.11, 226
See application file for complete search history.

(56) References Cited

U.S. PATENT DOCUMENTS

| | | |
|---|---|---|
| 5,202,855 A | 4/1993 | Morton |
| RE35,750 E | 3/1998 | Casper et al. |
| 5,783,934 A * | 7/1998 | Tran ............................ 323/312 |
| 5,872,737 A | 2/1999 | Tsuruda |
| 5,982,677 A * | 11/1999 | Fontana et al. ........ 365/189.09 |
| 6,532,167 B1 * | 3/2003 | Kaneko et al. .............. 365/149 |
| 2002/0071985 A1 | 6/2002 | Ooyama |
| 2002/0175747 A1 | 11/2002 | Tang et al. |
| 2003/0006650 A1 | 1/2003 | Tang et al. |

* cited by examiner

*Primary Examiner*—Vu A. Le
(74) *Attorney, Agent, or Firm*—Robert L. King

(57) ABSTRACT

A circuit and method of operation compensates for current pulses on a regulated voltage of a voltage supply. The regulated voltage supply is coupled to a plurality of loads that are enabled by a first set of control signals. The enable loads place current pulses having a predetermined plurality on the regulated voltage supply. A second set of control signals enable compensation circuitry to place current pulses of an opposite polarity on the regulated voltage supply. The loads are mimicked to generate a signal that approximates a current pulse length of the enabled loads. Another circuit generates a pulse that approximates a current pulse amplitude of the pulse caused by the enabled loads. By generating compensating pulses of opposite polarity having similar duration and amplitude as the pulses caused by the switching loads, the regulated voltage is more accurately maintained.

20 Claims, 5 Drawing Sheets

CIRCUIT AND METHOD FOR CURRENT PULSE COMPENSATION

FIELD OF THE INVENTION

This invention relates generally to semiconductor circuits, and more specifically, to compensation of current pulses on regulated voltage conductors used in semiconductor circuits.

BACKGROUND OF THE INVENTION

Switching of semiconductor devices such as transistors in electronic circuits can cause undesirable current pulses on regulated lines which adversely affect the performance of such circuits. Many types of circuits experience this problem. For example, a circuit with dynamic loads may experience power supply transients which may degrade the performance of the circuit by causing ground and supply bounce, thereby possibly introducing errors in digital circuit signals.

Traditional techniques for correcting such current pulses typically involve using a control loop to sense such current pulses and to provide feedback to correct the effect of the current pulse. Such techniques are useful when the specifics of a dynamic load are unpredictable. However, these feedback loops often have bandwidth problems. For example, current pulses can occur at high frequencies which present difficulties for typical feedback loops. In such circumstances, it is a common occurrence that a feedback loop will be too slow to correct for the effects of the current pulses, and even too slow in ceasing to correct, thereby overcorrecting and causing problems instead of correcting for the effects of current pulses. Notably, these techniques use complicated circuits to detect the actions of a load rather than anticipating the actions of the load.

BRIEF DESCRIPTION OF THE DRAWINGS

The present invention is illustrated by way of example and not limited in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
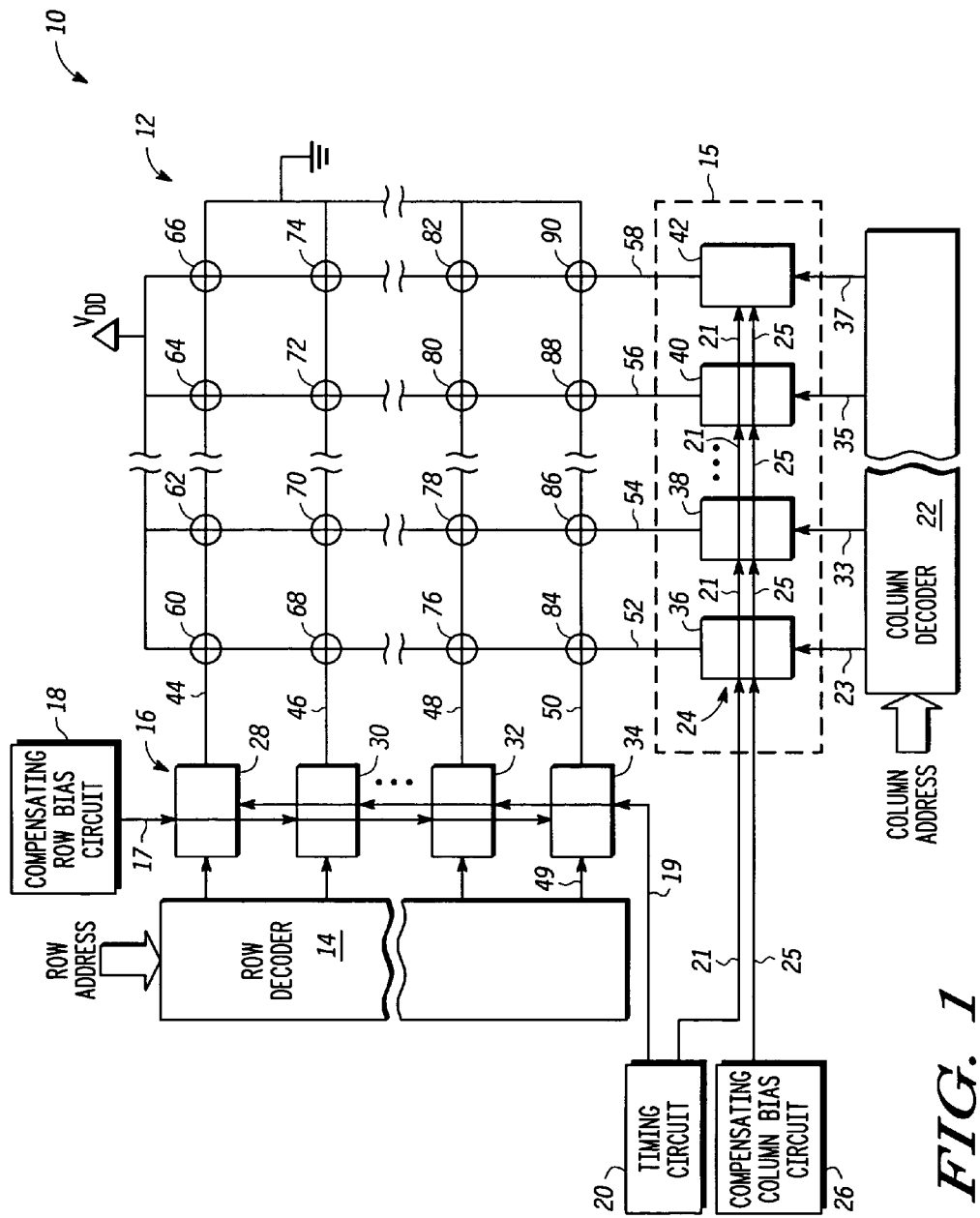
FIG. 1 is a block diagram of a memory according to one embodiment of the invention.

Illustrated in FIG. 1 is a memory 10 having an array 12 of magnetoresistive memory (MRAM) cells, a row decoder 14 for receiving a row address, a plurality of row write drivers 16 coupled to row decoder 14, a compensating row bias circuit 18 coupled to the row write drivers 16 via a voltage conductor 17 that provides a regulated voltage, a timing circuit 20 coupled to the row write drivers 16, a column decoder 22 for receiving a column address, a plurality of column write drivers 24 coupled to column decoder 22 and timing circuit 20, and a compensating column bias circuit 26 coupled to the column write drivers 24 via a voltage conductor 25 that provides a regulated voltage. Row decoder 14 provides a plurality of decoded row select signals, such as row select signal 49. Array 12 includes row write lines 44, 46, 48 and 50, column write lines 52, 54, 56, and 58, and MRAM cells 60, 62, 64, 66, 68, 70, 72, 74, 76, 78, 80, 82, 84, 86, 88, and 90. A plurality of row write drivers 16 include row write driver 28, which is coupled to row write line 44, row write driver 30, which is coupled to row write line 46, row write driver 32, which is coupled to row write line 48, and row write driver 34, which is coupled to row write line 50. Column decoder 22 provides a plurality of decoded row select signals, such as row select signal 23. A plurality of column write drivers 24 include column write driver 36, which is coupled to column write line 52, column write driver 38, which is coupled to column write line 54, column write driver 40, which is coupled to column write line 56, and column write driver 42, which is coupled to column write line 58. It should be understood that memory 10 typically includes many more memory cells as indicated by the interrupted row write lines and column write lines. Additionally, memory 10 typically includes other features such as address buffers, word lines and bit lines for reading, sense amplifiers for reading, input buffers for receiving data to be written, and output buffers (not shown). Such a memory is described in U.S. patent application Ser. No. 10/185,888, Pub. No. U.S. 2004/0001360 A1, titled "Memory Architecture with Write Circuitry and Method Therefor," filed Jun. 28, 2002 and published Jan. 1, 2004.

In one form of memory 10, MRAM cells 60–90 are MRAM cells that are written (programmed) by toggling. In this case a particular memory cell, such as memory cell 84 is written by overlapping write pulses. Whether the current is first applied to column write line 52 or row write line 50 is somewhat arbitrary because the cell can be effectively written either way. Which of these is optimum may be more related to the amount of disturb on adjacent cells and other factors. Assuming in this case that current is applied in the row direction first, a current pulse will be applied to row write line 50 by row write driver 34 while no current is applied to column write line 52 by column write driver 36. This timing is controlled by timing circuit 20 that has a first output 19 connected to control inputs of the row write drivers 16 and a second output providing timing signal 21 connected to control inputs of the column write drivers 24. The current magnitude of the current pulse applied to row write line 50 is controlled by compensating row bias circuit 18. While row write driver 34 is still applying the current pulse to row write line 50, a current pulse is applied to column write line 52 by column write driver 36. The magnitude of the current of this current pulse is controlled by compensating column bias circuit 26. While column write driver 36 is applying the current pulse to column write line 52, row write driver 34 terminates the current pulse applied to row write line 50. After the current pulse applied to row write line 50 has been terminated, the pulse applied to column write line 52 is terminated. This completes the toggling of the state of memory cell 84. The column write drivers 24 and the row write drivers 16 have benefits that make them particularly well suited for this type of toggling.

Figure 2:
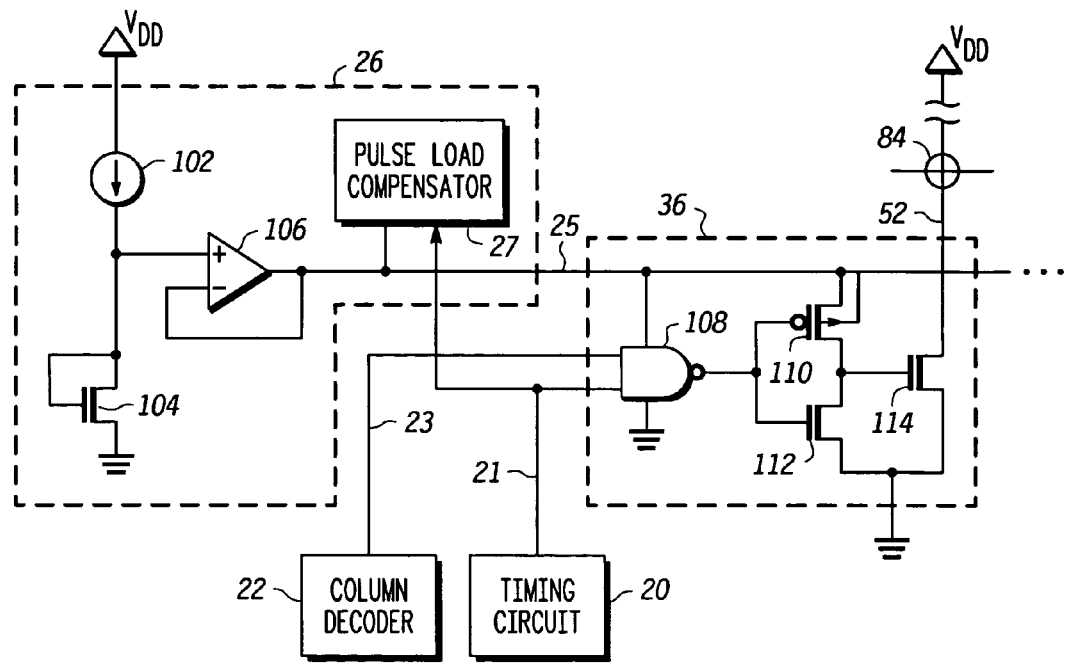
FIG. 2 is a combination block diagram and circuit diagram of, inter alia, an exemplary compensating bias circuit and an exemplary column write driver of FIG. 1.

Illustrated in FIG. 2 are memory cell 84, column write driver 36, compensating column bias circuit 26, column decoder 22, and timing circuit 20 of FIG. 1. Compensating column bias circuit 26 and column write driver 36 are shown in circuit diagram form. Compensating column bias circuit 26 has a current source 102, an N-channel transistor 104, and a unity gain amplifier 106. Current source 102 has a first terminal connected to a first positive power supply terminal labeled $V_{DD}$ and has a second terminal. Current flows from the first terminal to the second terminal. An N-channel transistor 104 has a control electrode and a first current electrode (drain in this case) connected together and to the second terminal of the current source 102. Transistor 104 has a second current electrode connected to a second power supply terminal, in this case, ground. In the illustrated form the second power supply terminal operates at a lower voltage potential than the first positive power supply terminal. It should be understood that opposite voltage polarities and opposite transistor conductivities may be implemented.

A unity gain amplifier 106 has a first terminal connected to the second terminal of current source 102 and has an output. This output of unity gain amplifier 106 is the output of compensating column bias circuit 26 and is coupled to the column write drivers, including column write driver 36 as shown in FIG. 2. The output of unity gain amplifier 106 is the voltage conductor 25 and provides a regulated voltage. Unity gain amplifier 106 in this example is achieved by an operational amplifier in which the non-inverting input is connected to the second terminal of current source 102 and the inverting input is coupled to the output of the operational amplifier. Transistor 104, in the well-understood current mirror configuration, establishes a bias voltage useful for establishing a current through another transistor that is directly proportional to the current through transistor 104. The ratio of the currents is well understood to be based on the ratio of the size of transistor 104 to that of the other transistor that receives the bias voltage. This bias voltage is buffered by unity gain amplifier 106 because it is received by many column write drivers in addition to column write driver 36. The number of column write drivers is generally going to be large, for example 1,024.

Column write driver 36 includes a NAND gate 108, a P-channel transistor 110, an N-channel transistor 112, and an N-channel transistor 114. NAND gate 108 has a first input connected to the output of column decoder 22, a second input coupled to the second output of timing circuit 20 that provides timing signal 21, and an output. The timing signal 21 of timing circuit 20 is also connected to the pulse load compensator 27. Transistor 110 has a gate (control electrode) connected to the output of NAND gate 108, a source connected to the output of unity gain amplifier 106, and a drain. The body and source of transistor 110 are tied together. Transistor 112 has a gate connected to the output of NAND gate 108, a drain connected to the drain of transistor 110, and source connected to the ground power supply terminal. Transistor 114 has a control electrode connected to the drains of transistors 110 and 112, a drain connected to column write line 52, and a source connected to the ground power supply terminal. Column write line 52 is connected to memory cell 84. Transistor 114 is significantly larger in terms of current drive strength than transistor 104. The channel lengths of both transistors are preferably the same with the channel width of transistor 114 being significantly larger than that of transistor 104. This ratio is preferably in the order of 100.

In operation, when column write line 52 is selected, column decoder 22 outputs a logic high to NAND gate 108. Timing circuit 20 provides a positive going pulse at the time current is to be supplied through column write line 52. The application of the logic high by the pulse from timing circuit 20 causes NAND gate 108 to output a logic low that causes transistor 110 to become conductive. Transistor 110 thereby operates as a switch that couples the output of unity gain amplifier 106 to the gate of transistor 114. Transistor 114 becomes conductive when its gate voltage exceeds a transistor threshold voltage wherein the magnitude of the gate voltage controls the magnitude of current conducted through transistor 114. The current conducted by transistor 114 is controlled in a conventional current mirror operation in which the current conducted by transistor 104 is reflected to transistor 114 via unity gain amplifier 106 and transistor 110. The ratio of transistor channel widths of transistors 104 and 114 is set to obtain the desired current through column write line 52. The current supplied by current source 102 is carefully controlled and known. The channel width ratios are then selected to achieve the desired current through column write line 52 for the generation of the desired magnetic field for writing the memory cells connected to column write line 52. In one form memory cell 84 is a magnetoresistive random access memory (MRAM) cell and, in particular, an MRAM that is programmed by toggling.

When it is time to terminate the current through column write line 52, timing circuit terminates the pulse so that NAND gate 108 switches its output to a logic high causing transistor 112 to be conductive and transistor 110 to be non-conductive. With transistor 112 conductive, the gate of transistor 114 is coupled to its source causing it be non-conductive and thereby terminating the write current through column write line 52. Thus, in this operation, the only transistor that has to pass the large write current is transistor 114. This transistor 114, due to the large current it must carry, is far larger than all of the other transistors combined that form column write driver 36. Any additional transistor in the current path of column write line 52 would also have to be of comparable size and thus greatly increase the area of the write drivers. Thus, there is provided a controlled current through column write line 52 and MRAM cells 84, 76, 68, and 60 that are connected to column write line 52 while only having to have one transistor that is physically large relative to the other transistors of the memory 10.

It should be understood that column decoder 22 provides a logic low output to all of the column write drivers that are not selected. Thus the signal from column decoder 22 that is associated with column write line 52 is brought to a logic low when column write line 52 is deselected. This keeps the output of NAND gate 108 at a logic high, which causes transistor 112 to be conductive and transistor 110 to be non-conductive. In that condition, transistor 114 has its gate coupled to its source and is thereby non-conductive.

Each write driver such as column write driver 36 is a potential load on the unity gain amplifier 106. As a write driver, such as column write driver 36, is activated, the gate capacitance of driver transistor 114 is charged through transistor 110 and voltage conductor 25. As a result of connecting the various write drivers, undesired current pulses are injected onto the regulated voltage provided to voltage conductor 25. Therefore, the pulse load compensator 27 is connected to the output of unity gain amplifier 106 to actively compensate in the current mirror operation described above for the variable load effects which inject undesired current pulses onto the regulated voltage used to bias transistor 114.

Figure 3:
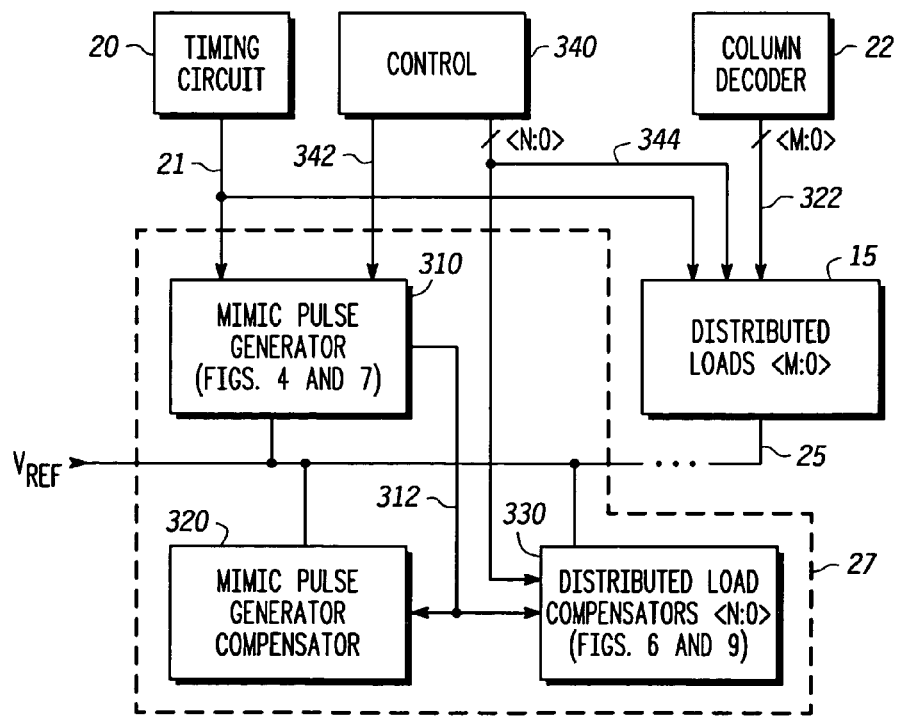
FIG. 3 is a block diagram of, inter alia, an exemplary pulse load compensator of FIG. 2.

FIG. 3 illustrates in block diagram form an exemplary pulse load compensator 27 of FIG. 2. For convenience of explanation, element numbers common between the figures are maintained. Pulse load compensator 27 includes a mimic pulse generator 310, a mimic pulse generator compensator 320 and distributed load compensators <N:0> 330, where N is an integer value. Each of mimic pulse generator 310, mimic pulse generator compensator 320, distributed load compensators <N:0> 330 and distributed loads <M:0> has a voltage terminal that is connected to a reference voltage labeled $V_{REF}$. The value M is also an integer value. In the illustrated form N may be the same or less than M depending upon the amount of compensation desired. The timing circuit 20 has an output connected to a first input of the mimic pulse generator 310 to provide the timing signal 21. A control circuit 340 has a first output connected to a second input of the mimic pulse generator 310. A second output of control circuit 340 having a bit width of <N:0> is connected to a first input of the distributed load compensators <N:0> 330. The second output of control circuit 340 is also connected to a first input of distributed loads <M:0> 15. The output of timing circuit 20 is connected to a second input of distributed loads <M:0> 15. Column decoder 22 has an output connected to a third input of distributed loads <M:0> 15.

In operation, each write driver of the plurality of column write drivers 24 is a potential load on $V_{REF}$ upon activation. Typically, a subset of memory cells (up to N+1 cells of the M+1 possible cells as selected by the row decoder 14) is toggled during any given write cycle and thus N is usually implemented to be less than M. For example, M might be 1,024 but N only 4. The subset of distributed loads is activated according to control signals 322 received from column decoder 22 and to control signals 344 received from control circuit 340 in accordance with timing controlled by timing signal 21. Control signals 322 select N+1 columns of array 12. For example, control signals 322 select 4 of 1,024 columns. Control signals 344 select a subset of the N+1 columns for toggling. For example, the first and third of the four selected columns might be selected for toggling.

Activation of the different columns for toggling causes current spikes on $V_{REF}$ along voltage conductor 25. A corresponding subset of distributed load compensators 330 is activated to provide current spikes of opposite polarity to compensate for (e.g., diminish the effect of) the current spikes caused by the distributed loads <M:0> 15. Distributed load compensators <N:0> 330 are discussed in greater detail below with reference to FIGS. 6 and 9.

The subset of distributed load compensators <N:0> 330 is selected by control signals 344 received from control circuit 340 and activated by control signal 312 received from mimic pulse generator 310. Mimic pulse generator 310 also can cause a current spike on $V_{REF}$. Therefore, mimic pulse generator compensator 320 is connected to voltage conductor 25 to provide a current spike of opposite polarity to compensate for the current spike caused by mimic pulse generator 310.

Rather than sensing the current spikes of distributed loads <M:0> 15 and responding to them, mimic pulse generator 310 anticipates the current spikes and initiates compensation for the current spikes. The current spikes are initiated by distributed loads <M:0> 15 being selected in response to control signals 344 and timing signal 21. Mimic pulse generator 310 receives control signal 342 and timing signal 21 and initiates current spike compensation responsive to control signal 342 and timing signal 21. Mimic pulse generator 310 mimics the switching characteristics of the distributed loads 15 to generate a pulse for control signal 312 that approximates the length of the current pulse, thereby communicating the timing of the expected current pulse from distributed loads <M:0> 15 to distributed load compensators <N:0> 330. The operation of mimic pulse generator 310 is discussed in greater detail below with reference to two exemplary forms illustrated in FIGS. 4 and 7 and the respective timing diagrams in FIGS. 5 and 8.

Figure 4:
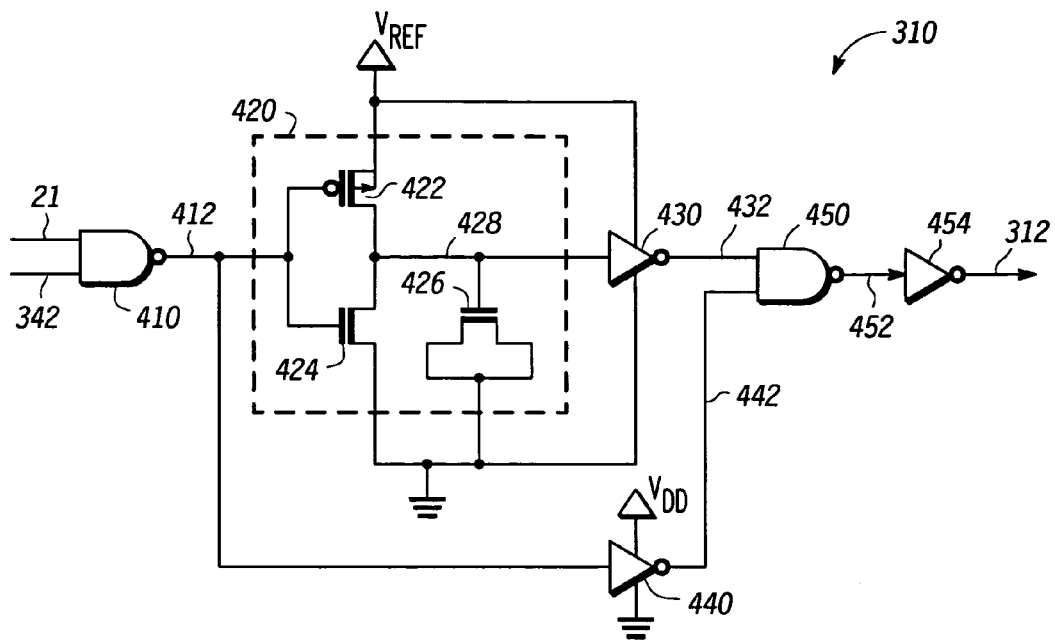
FIG. 4 is a circuit diagram of an exemplary mimic pulse generator of the pulse load compensator of FIG. 3.

Referring to FIG. 4, mimic pulse generator 310 includes a delay element 420 with associated logic circuitry. The timing signal 21 is connected to a first input of a NAND gate 410. Control signal 342 is connected to a second input of NAND gate 410. An output of NAND gate 410 is connected to control electrodes or gates of a P-channel transistor 422 and an N-channel transistor 424 at a node 412. Transistor 422 has a source connected to the $V_{REF}$ voltage of voltage conductor 25 and has a drain connected to a drain of transistor 424 at a node 428. A source of transistor 424 is connected to a ground voltage terminal. An N-channel transistor 426 has a gate connected to node 428 and a source and drain thereof connected together and to the ground voltage terminal. An inverter 430 has an input connected to node 428, and has an output connected to a first input of a NAND gate 450 at a node 432. Inverter 430 is powered between $V_{REF}$ and the ground voltage terminal and therefore has respective terminals connected to each voltage potential. An inverter 440 has an input connected to node 412 and an output connected to a second input of NAND gate 450 at a node 442. Inverter 440 is powered between $V_{DD}$ and the ground voltage terminal and therefore has respective terminals connected to each voltage potential. NAND gate 450 has an output connected to an input of inverter 454 at a node 452. An output of inverter 454 provides the control signal 312.

In operation, mimic pulse generator 310 includes the delay element 420 to mimic the switching characteristics of column write driver 36 so as to anticipate the timing of current pulses generated by column write driver 36. Specifically, transistors 422, 424 and 426 of the mimic pulse generator 310 correspond to transistors 110, 112 and 114, respectively, of column write driver 36. The delays provided by delay element 420 and inverter 430 are coupled to receive power from $V_{REF}$, and inverter 440 is coupled to receive power from $V_{DD}$. The delay element 420 receives $V_{REF}$ to mimic the connections of transistor 110 and transistor 112 to $V_{REF}$. Inverter 430 is coupled to $V_{REF}$ so that the inverter threshold tracks the variation of $V_{REF}$. As illustrated in FIG. 4, the transistor well (as referred to as the "body") of transistor 422 is coupled to $V_{REF}$. This connectivity enables transistor 422 to function with similar characteristics as corresponding transistor 110. If the wells of transistors 422 and 110 were coupled to $V_{DD}$ in the typical fashion, the well-to-source voltages would be different for each transistor, resulting in different currents flowing through the transistors. The well-to-source connection also provides a lower threshold for each transistor and therefore more drive current.

Figure 5:
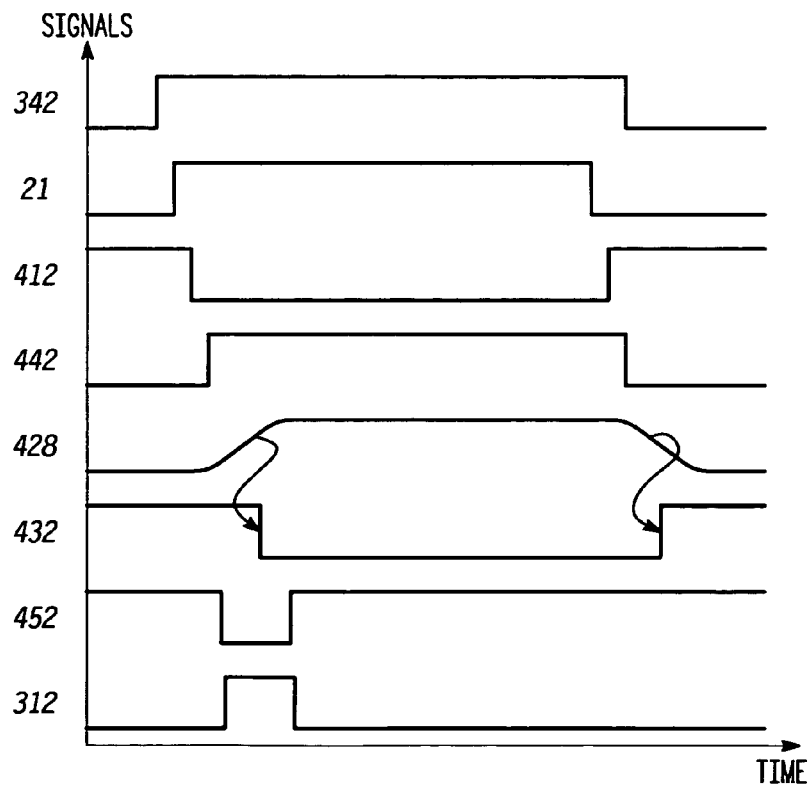
FIG. 5 is a timing diagram of the mimic pulse generator of FIG. 4.

Illustrated in FIG. 5 is a timing diagram of an exemplary operation of mimic pulse generator 310. When both the control signal 342 and the timing signal 21 are asserted (i.e.

active or logic high), the output of NAND gate 410 at node 412 is inactive (i.e. a logic low). In response, the output of inverter 440 at node 442 is asserted. In response, node 452 transitions to an inactive or low value. After a logic gate delay, the output of inverter 454 which is control signal 312 transitions to an active or high value. Meanwhile, node 428 transitions at a slower rate due to the capacitive loading of transistor 426. When node 428 reaches a certain voltage, the output of inverter 430 transitions to an inactive or unasserted value. That transition will cause node 452 to transition back to an active state. After a logic gate delay from the transition of node 452, the control signal 312 transitions to a logic low. At some subsequent later point in time both the control signal 342 and the timing signal 21 are de-asserted. Thus it can been seen that for each concurrent assertion of the control signal 342 and the timing signal 21, there is generated one pulse of duration that is determined proportionately to the value of the capacitance of transistor 426 which is, in turn, proportional to transistor 114 and thus proportional to the switching time of the write driver loading voltage conductor 25.

Figure 6:
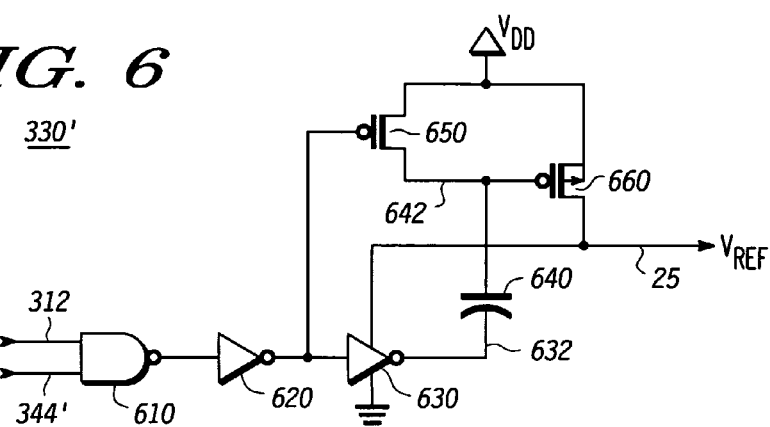
FIG. 6 is a circuit diagram of an exemplary distributed load compensator of the pulse load compensator of FIG. 3.

Illustrated in FIG. 6 is a circuit diagram of an exemplary load compensator 330' of the distributed load compensators <N:0> 330 of FIG. 3. Load compensator 330' is one of a plurality of load compensators 330. Load compensator 330' receives a control signal 344' which is one of a set of control signals 344. A NAND gate 610 has a first input connected to the control signal 344' and a second input connected to the control signal 312. An output of NAND gate 610 is connected to an input of an inverter 620. An output of inverter 620 is connected to an input of an inverter 630 and to a gate of a P-channel transistor 650. A source of transistor 650 is connected to a power supply voltage terminal for receiving a power supply voltage $V_{DD}$. A drain of transistor 650 is connected to a gate of a P-channel transistor 660 and to a first electrode of a capacitor 640 at a node 642. A source and a body connection of transistor 660 are connected to a power supply voltage terminal for receiving a power supply voltage $V_{DD}$. A drain of transistor 660 is connected to the reference voltage $V_{REF}$ at voltage conductor 25. An output of inverter 630 is connected to a second electrode of capacitor 640 at a node 632. Inverter 630 is referenced between two voltage potentials, $V_{REF}$ and ground. In other words a first supply terminal of inverter 630 is connected to voltage conductor 25 and a second supply terminal of inverter 630 is connected to ground.

In operation, control signal 344' enables load compensator 330' when a corresponding load (i.e. a write driver) is to be selected. The load compensation of load compensator 330' is triggered responsive to receiving an asserted control signal 312 (e.g., a voltage pulse). Control signal 312 controls both the timing and the length of asserted time (i.e. pulse width) of a load initiated current pulse, and therefore controls the timing and width of a current pulse initiated by load compensator 330'. Prior to the arrival of an asserted pulse of control signal 312, transistor 650 is conductive, thereby connecting the first electrode of capacitor 640 to $V_{DD}$. The output of inverter 630 is $V_{REF}$ since the inverter is referenced to $V_{REF}$. Therefore, the second electrode of capacitor 640 is connected to $V_{REF}$. When control signal 344' enables load compensator 330', and control signal 312 asserts a pulse, the output of inverter 620 goes to $V_{DD}$, turning off transistor 650 and causing the output of inverter 630 to go to ground potential. The voltage across capacitor 640 remains substantially constant. Therefore as node 632 changes from $V_{REF}$ to ground, node 642 goes from $V_{DD}$ to ($V_{DD}$-$V_{REF}$). The voltage shift of node 642 turns on transistor 660 so that the gate-to-source voltage of transistor 660 is -$V_{REF}$ which is the same voltage as the gate-to-source voltage of a corresponding current pulse initiating transistor of distributed loads <M:0> 15 (transistor 110 of FIG. 2). Note that the body of transistor 660 is connected to its source as the body of transistor 110 is connected to its source. This ensures that the length of time and amplitude of the load current pulse and the compensator current pulse substantially match. The mimic pulse generator compensator 320 is the same circuit as the load compensator 330' of FIG. 6. In one embodiment, the p-channel transistor 660 of the mimic pulse generator compensator 320 may be slightly larger (e.g., 300 microns as opposed to 290 microns) than the corresponding transistor in the load compensator 330'.

Figure 7:
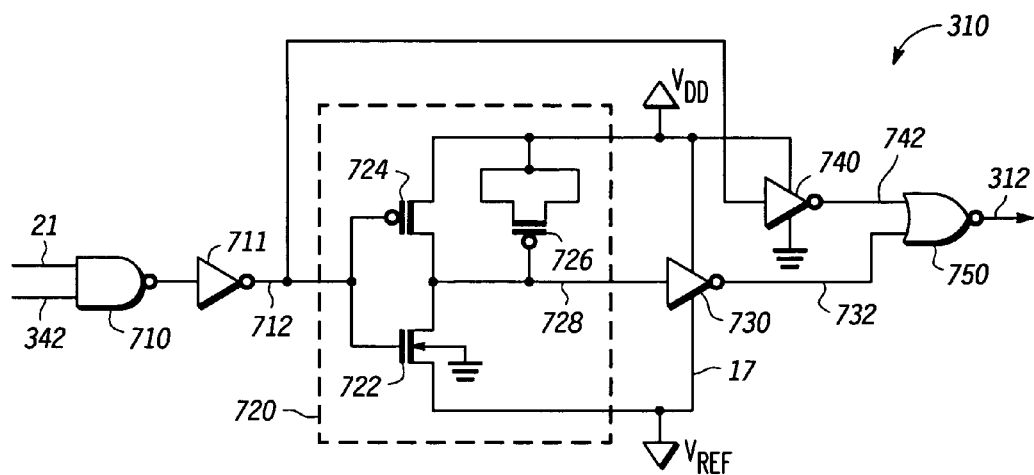
FIG. 7 is a circuit diagram of another exemplary mimic pulse generator of the pulse load compensator of FIG. 3.

Illustrated in FIG. 7 is a circuit diagram of another exemplary mimic pulse generator 310 of the pulse load compensator 27 of FIG. 3. In particular, the mimicking drive transistor of FIG. 7 is implemented as a P-channel transistor to mimic drive transistor 1014 in FIG. 10 below rather than an N-channel transistor (transistor 426 of FIG. 4).

Mimic pulse generator 310 of FIG. 7 includes a delay element 720 with associated logic circuitry. The timing signal 21 is connected to a first input of a NAND gate 710. Control signal 342 is connected to a second input of NAND gate 710. An output of NAND gate 710 is connected to an input of an inverter 711. An output of inverter 711 is connected to control electrodes or gates of a P-channel transistor 724 and an N-channel transistor 722 at a node 712. Transistor 724 has a source connected to the $V_{DD}$ voltage terminal and has a drain connected to a drain of transistor 722 at a node 728. A source of transistor 722 is connected to $V_{REF}$. A P-channel transistor 726 has a gate connected to node 728 and a source and drain thereof connected together and to the $V_{DD}$ voltage terminal. An inverter 730 has an input connected to node 728, and has an output connected to a first input of a NOR gate 750 at a node 732. Inverter 730 is powered between $V_{DD}$ and $V_{REF}$ and therefore has respective terminals connected to each voltage potential. An inverter 740 has an input connected to node 712 and an output that is connected to a second input of NOR gate 750 at a node 742. Inverter 740 is powered between $V_{DD}$ and the ground voltage terminal and therefore has respective terminals connected to each voltage potential. NOR gate 750 has an output that provides the control signal 312.

Figure 8:
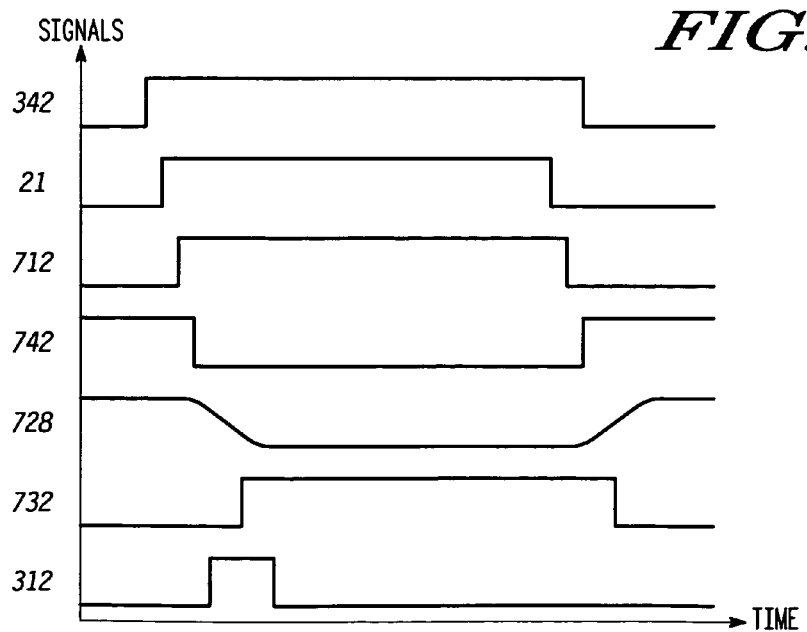
FIG. 8 is a timing diagram of the mimic pulse generator of FIG. 7.

Illustrated in FIG. 8 are timing signals associated with an exemplary operation of mimic pulse generator 310. Assume that both the control signal 342 and the timing signal 21 are asserted by transitioning from a low level to a high level. In response, node 712 transitions to a high level and node 742 transitions to a low level with a conventional amount of logic gate delay separating the transitions. The transitioning of node 742 causes the output of NOR gate 750 to change so that control signal 312 transitions to a high level. In response to the transition of node 712, the node 728 slowly transitions from a high level to a low level. However, once the voltage at node 728 has decreased to a predetermined point, inverter 730 is triggered to reverse its output level to a high level at node 732. With this transition, the output of NOR gate 750 changes back to a low level and remains at a low level even when control signal 342 and timing signal 21 transition to a low level. Mimic pulse generator 310 therefore functions to provide a pulse for control signal 312 whose length is proportional to the switching time of the column write driver 36 loading voltage conductor 25 as discussed in FIG. 5 above.

Figure 9:
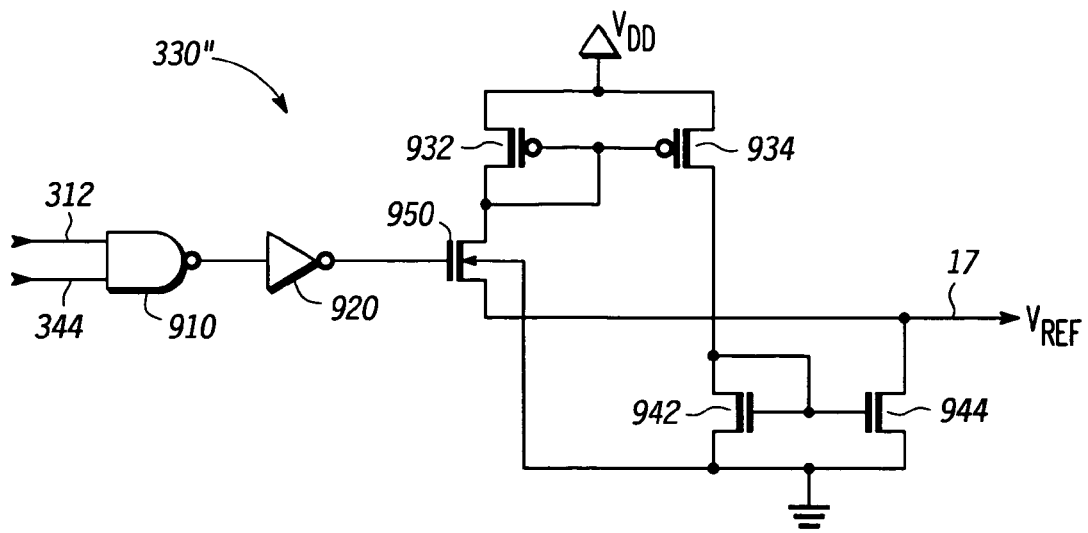
FIG. 9 is a circuit diagram of another exemplary distributed load compensator of the pulse load compensator of FIG. 3.
Figure 10:
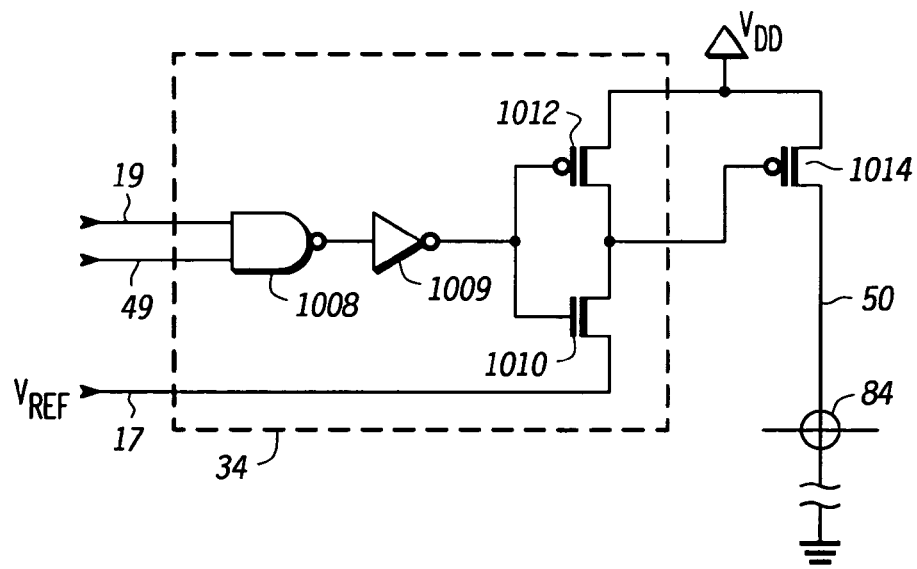
FIG. 10 is a circuit diagram of an exemplary row write driver and load of the memory of FIG. 1.

Illustrated in FIG. 9 is a circuit diagram of an exemplary distributed load compensator <N:0> 330" of the pulse load compensator 27 of FIG. 3 for current pulses in rows. Because FIG. 10 is a circuit diagram of an exemplary row driver, the two figures will be discussed jointly. FIG. 9 is analogous to the function of distributed load compensator <N:0> 330' of FIG. 6 but uses no capacitor. Control signal 312 is connected to a first input of NAND gate 910 and one control signal 344' of control signals 344 is connected to a second input of NAND gate 910. An output of NAND gate 910 is connected to an input of an inverter 920. An output of inverter 920 is connected to a gate of an N-channel transistor 950. A P-channel transistor 932 has a source connected to $V_{DD}$, a gate connected to a drain thereof and to a drain of transistor 950. A source of transistor 950 is connected to the voltage conductor 17 for providing $V_{REF}$. A well or the body of transistor 950 is connected to reference ground. A P-channel transistor 934 has a source connected to $V_{DD}$. Transistor 934 has a gate connected to the gate of transistor 932 and has a drain connected to a drain of an N-channel transistor 942. The drain of transistor 942 is connected to a gate thereof. A source of transistor 942 is connected to the ground reference. An N-channel transistor 944 has a drain connected to the voltage conductor 17, a gate connected to the gate of transistor 942 and a source connected to the reference ground.

In operation, when the output of inverter 920 transitions to a high level, transistor 950 turns on. Current conducted by transistor 950 is mirrored by transistors 932 and 934, and mirrored again by transistor 942 and transistor 944 with transistor 944 providing a compensating current to voltage conductor 17. The transistors are sized so that the compensating current from transistor 950 can compensate for adverse switching current associated with the load current from transistor 1110 of FIG. 10 and for the current conducted by transistor 950. In one embodiment, transistor 1110 of FIG. 10 is two parallel transistors, each being 1 micron wide by 0.35 microns long. Transistor 950 is one micron wide by 0.35 micron long. Each of the illustrated logical transistors 932 and 934 may be implanted using two physical transistors, each being four microns wide by 0.5 micron long, providing a 1:1 current ratio for the current mirror corresponding to transistors 932 and 934. The illustrated logical transistor 942 may be implemented using two physical transistors, each being two microns wide by 0.5 micron long. The illustrated logical transistor 944 may be implemented using six physical transistors, each being 2 microns wide by 0.5 micron long, thereby providing a 1:3 current ratio for the current mirror corresponding to transistors 942 and 944. Thus, the 3X compensating current of transistor 944 compensates for the 1X transistor 950 current pulse and the 2X transistor 1110 load current pulse.

Illustrated in FIG. 10 is an exemplary row write driver 34 of FIG. 1 and associated memory load. A NAND gate 1008 has a first input connected to the first output 19 of timing circuit 20 for receiving a timing signal. A second input of NAND gate 1008 is connected to a predetermined row select signal such as row select signal 49. An output of NAND gate 1008 is connected to an input of an inverter 1009. An output of inverter 1009 is connected to a gate of a P-channel transistor 1012 and to a gate of an N-channel transistor 1010. A source of transistor 1012 is connected to the $V_{DD}$ supply voltage and a drain of transistor 1012 is connected to a drain of transistor 1010. A source of transistor 1010 is connected to the $V_{REF}$ voltage conductor 17. A P-channel transistor 1014 has a source connected to the $V_{DD}$ supply voltage, a gate connected to the drain of transistor 1012 and a drain connected to row write line 50. Memory cell 84 and other memory cells are connected to row write line 50. The row write driver 34 functions to selectively drive transistor 1014 into conduction and connect the memory cells connected to row write line 50 to the $V_{DD}$ potential. The switching of transistor 1014 causes current pulses of a predetermined polarity (positive or negative) to be injected onto the $V_{REF}$ voltage conductor 17. Distributed load compensator <N:0> 330" functions to place current pulses of an opposite polarity to the predetermined polarity on the $V_{REF}$ conductor.

By now it should be apparent that there has been provided a method and circuit that compensates for current pulses placed on a regulated voltage supply. A first compensating circuit mimics the action of a write driver transistor switch and generates a pulse whose length is proportional to the switching time of the write driver. A second compensating circuit generates a current pulse that is proportional to the current required to charge the write driver gate. This current pulse is applied to a write bias line for canceling the write driver switch load on the write bias circuit. As a result the stress and the size and power of voltage regulator circuits may be reduced.

While specific embodiments are disclosed herein, it should be apparent that numerous modifications may be implemented. For example, while MOS transistors are described herein, any type of transistor may be used such as bipolar, GaAs and other transistor types. Also various types of memory cells may be used including various nonvolatile memory cells. Further, different types of MRAM memory cells may be used with the circuitry discussed herein.

In one form there is provided a method of compensating for current pulses on a regulated voltage provided by a regulated voltage supply. The regulated voltage supply is coupled to a plurality of loads. A first set of control signals from a controller is used to enable a predetermined number of the plurality of loads coupled to the regulated voltage, the predetermined number of the plurality of loads that are enabled placing current pulses having a predetermined polarity on the regulated voltage supply. A second set of control signals from the controller is used to enable compensation circuitry to place current pulses of an opposite polarity to the predetermined polarity on the regulated voltage supply. In one form the plurality of loads are electrically coupled in parallel between the regulated voltage supply and a supply voltage. In another form the predetermined number of the plurality of loads and the compensation circuitry are substantially concurrently enabled with the first set of control signals and the second set of control signals, respectively. In another form the compensation circuitry has transistors which are size ratioed to approximate electrical characteristics and capacitive loading effects of the plurality of loads.

In another form the compensation circuitry mimics the predetermined number of the plurality of loads to generate a signal that approximates a current pulse length of the predetermined number of the plurality of loads that are enabled. One or more circuits are provided which respectively generate a pulse which approximates a current pulse amplitude of the predetermined number of the plurality of loads that are enabled. In another form the first set of control signals and the second set of control signals use a same set of control signals. In another form the first set of control signals and the second set of control signals are implemented with one or more enable signals and a timing signal. In another form the predetermined number of the plurality of loads is implemented as substantially similar load circuits.

In another form there is also provided a circuit for compensating for current pulses on a regulated voltage. A first voltage terminal receives the regulated voltage. A plurality of loads is coupled to the first voltage terminal, the plurality of loads being coupled between the regulated voltage and a second voltage terminal. A controller is coupled to the plurality of loads, the controller providing a first set of control signals to enable a predetermined number of the plurality of loads that are coupled to the regulated voltage, the predetermined number of the plurality of loads that are enabled placing current pulses having a predetermined polarity on the regulated voltage supply, the controller also providing a second set of control signals. Compensation circuitry is coupled to the first voltage terminal and the controller, the compensation circuitry using the second set of control signals from the controller to enable the compensation circuitry to place current pulses of an opposite polarity to the predetermined polarity on the regulated voltage supply. Each of the plurality of loads includes a pair of transistors of opposite conductivity connected in series between the first voltage terminal and the second voltage terminal, each of the pair of transistors providing a drive signal for use in controlling writing to one or more predetermined memory cells. Also in one form the one or more predetermined memory cells are magnetoresistive random access memory (MRAM) memory cells. In another form the compensation circuitry includes circuitry having transistors which are size-ratioed to the pair of transistors of opposite conductivity to approximate electrical characteristics and capacitive loading effects of the plurality of loads. In another form the controller substantially concurrently enables the compensation circuitry and the predetermined number of the plurality of loads. The compensation circuitry includes a mimic pulse generator circuit coupled to the first voltage terminal to mimic the predetermined number of the plurality of loads to generate a signal that approximates a current pulse length of the predetermined number of the plurality of loads. The compensation circuitry also includes one or more load compensation circuits coupled to the first voltage terminal to mimic a current pulse amplitude of the predetermined number of the plurality of loads. In another form there is provided mimic pulse generator circuit compensation circuitry coupled to the first voltage terminal to place a compensating current pulse of opposite polarity from a current pulse added to the first voltage terminal by the mimic pulse generator circuit. In another form the first set of control signals and the second set of control signals are a same set of control signals. Each of the first set of control signals and the second set of control signals include one or more enable signals and a timing signal. In another form there is provided a circuit for compensating for current pulses on a regulated voltage having a first voltage terminal for receiving the regulated voltage. A plurality of loads for respectively driving a plurality of memory cells is provided wherein the plurality of loads is coupled to the first voltage terminal and between the regulated voltage and a second voltage terminal. Control and timing circuitry is coupled to the plurality of loads, the control and timing circuitry providing a first set of control signals having separate enable and timing components to selectively enable a predetermined number of the plurality of loads that are coupled to the regulated voltage, the predetermined number of the plurality of loads that are enabled placing current pulses having a predetermined polarity on the regulated voltage supply, the control and timing circuitry also providing a second set of control signals also having separate enable and timing components. A mimic pulse generator circuit is coupled to the first voltage terminal to mimic the predetermined number of the plurality of loads to generate a signal that approximates a current pulse length of the predetermined number of the plurality of loads. A load compensation circuit is coupled to the first voltage terminal to mimic a current pulse amplitude of the predetermined number of the plurality of loads. A mimic pulse generator circuit compensation device is coupled to the first voltage terminal to place a compensating current pulse of opposite polarity from a current pulse added to the first voltage terminal by the mimic pulse generator circuit. In one form the mimic pulse generator circuit further includes circuitry having transistors which are size-ratioed to transistors forming the plurality of loads to approximate electrical characteristics and capacitive loading effects of the plurality of loads.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. Accordingly, the specification and figures are to be regarded in an illustrative rather than a restrictive sense, and all such modifications are intended to be included within the scope of the present invention.

What is claimed is:

1. A method of compensating for current pulses on a regulated voltage provided by a regulated voltage supply, comprising:
   coupling the regulated voltage supply to a plurality of loads;
   using a first set of control signals from a controller to enable a predetermined number of the plurality of loads coupled to the regulated voltage, the predetermined number of the plurality of loads that are enabled placing current pulses having a predetermined polarity on the regulated voltage supply; and
   using a second set of control signals from the controller to enable compensation circuitry to place current pulses of an opposite polarity to the predetermined polarity on the regulated voltage supply.

2. The method of claim 1 further comprising:
   electrically coupling the plurality of loads in parallel between the regulated voltage supply and a supply voltage.

3. The method of claim 1 further comprising:
   substantially concurrently enabling the predetermined number of the plurality of loads and the compensation circuitry with the first set of control signals and the second set of control signals, respectively.

4. The method of claim 1 further comprising:
   using compensation circuitry having transistors which are size ratioed to approximate electrical characteristics and capacitive loading effects of the plurality of loads.

5. The method of claim 4 wherein using the compensation circuitry further comprises:

mimicking the predetermined number of the plurality of loads to generate a signal that approximates a current pulse length of the predetermined number of the plurality of loads that are enabled; and providing one or more circuits which respectively generate a pulse which approximates a current pulse amplitude of the predetermined number of the plurality of loads that are enabled.

6. The method of claim 1 wherein using the first set of control signals and using the second set of control signals further comprise:

using a same set of control signals.

7. The method of claim 1 further comprising:

implementing each of the first set of control signals and the second set of control signals with one or more enable signals and a timing signal.

8. The method of claim 1 further comprising:

implementing the predetermined number of the plurality of loads as substantially similar load circuits.

9. A circuit for compensating for current pulses on a regulated voltage, comprising:

a first voltage terminal for receiving the regulated voltage;

a plurality of loads coupled to the first voltage terminal, the plurality of loads being coupled between the regulated voltage and a second voltage terminal;

a controller coupled to the plurality of loads, the controller providing a first set of control signals to enable a predetermined number of the plurality of loads that are coupled to the regulated voltage, the predetermined number of the plurality of loads that are enabled placing current pulses having a predetermined polarity on the regulated voltage, the controller also providing a second set of control signals; and compensation circuitry coupled to the first voltage terminal and the controller, the compensation circuitry using the second set of control signals from the controller to enable the compensation circuitry to place current pulses of an opposite polarity to the predetermined polarity on the regulated voltage.

10. The circuit of claim 9 wherein each of the plurality of loads further comprise:

a pair of transistors of opposite conductivity connected in series between the first voltage terminal and the second voltage terminal, each of the pair of transistors providing a drive signal for use in controlling writing to one or more predetermined memory cells.

11. The circuit of claim 10 wherein the one or more predetermined memory cells are magnetoresistive random access memory (MRAM) memory cells.

12. The circuit of claim 10 wherein the compensation circuitry further comprises:

circuitry having transistors which are size ratioed to the pair of transistors of opposite conductivity to approximate electrical characteristics and capacitive loading effects of the plurality of loads.

13. The circuit of claim 9 wherein the controller substantially concurrently enables the compensation circuitry and the predetermined number of the plurality of loads.

14. The circuit of claim 9 wherein the compensation circuitry further comprises:

a mimic pulse generator circuit coupled to the first voltage terminal to mimic the predetermined number of the plurality of loads to generate a signal that approximates a current pulse length of the predetermined number of the plurality of loads; and one or more load compensation circuits coupled to the first voltage terminal to mimic a current pulse amplitude of the predetermined number of the plurality of loads.

15. The circuit of claim 14 further comprising:

mimic pulse generator circuit compensation means coupled to the first voltage terminal to place a compensating current pulse of opposite polarity from a current pulse added to the first voltage terminal by the mimic pulse generator circuit.

16. The circuit of claim 9 wherein the first set of control signals and the second set of control signals are a same set of control signals.

17. The circuit of claim 9 wherein each of the first set of control signals and the second set of control signals comprise one or more enable signals and a timing signal.

18. A circuit for compensating for current pulses on a regulated voltage, comprising:

a first voltage terminal for receiving the regulated voltage;

a plurality of loads for respectively driving a plurality of memory cells, the plurality of loads being coupled to the first voltage terminal and between the regulated voltage and a second voltage terminal;

control and timing circuitry coupled to the plurality of loads, the control and timing circuitry providing a first set of control signals having separate enable and timing components to selectively enable a predetermined number of the plurality of loads that are coupled to the regulated voltage, the predetermined number of the plurality of loads that are enabled placing current pulses having a predetermined polarity on the regulated voltage, the control and timing circuitry also providing a second set of control signals also having separate enable and timing components;

a mimic pulse generator circuit coupled to the first voltage terminal to mimic the predetermined number of the plurality of loads to generate a signal that approximates a current pulse length of the predetermined number of the plurality of loads; and a load compensation circuit coupled to the first voltage terminal to mimic a current pulse amplitude of the predetermined number of the plurality of loads.

19. The circuit of claim 18 further comprising:

mimic pulse generator circuit compensation means coupled to the first voltage terminal to place a compensating current pulse of opposite polarity from a current pulse added to the first voltage terminal by the mimic pulse generator circuit.

20. The circuit of claim 18 wherein the mimic pulse generator circuit further comprises:

circuitry having transistors which are size ratioed to transistors forming the plurality of loads to approximate electrical characteristics and capacitive loading effects of the plurality of loads.

* * * * *